United States Patent [19]
Goldstein

[11] 4,354,175
[45] Oct. 12, 1982

[54] ANALOG/DIGITAL CONVERTER UTILIZING A SINGLE COLUMN OF ANALOG SWITCHES

[75] Inventor: Ira L. Goldstein, Dallas, Tex.

[73] Assignee: Mostek Corporation, Carrollton, Tex.

[21] Appl. No.: 145,550

[22] Filed: May 1, 1980

[51] Int. Cl.³ .......................................... H03K 13/11
[52] U.S. Cl. ............................ 340/347 AD; 307/449; 307/361; 340/347 DA; 340/347 M; 328/119
[58] Field of Search ................ 340/347 AD, 347 DA, 340/347 M; 307/449, 450, 361; 328/119

[56] References Cited
U.S. PATENT DOCUMENTS
4,045,793  8/1977  Moench ........................ 340/347 DA FOREIGN PATENT DOCUMENTS
2029658  3/1980  United Kingdom ........ 340/347 DA Primary Examiner—Thomas J. Sloyan

[57] ABSTRACT

An analog switch for an analog-to-digital converter which permits an analog voltage level to be read from a series resistor ladder network and be compared to an external analog signal by a comparator. The incremental levels of the series resistor ladder network are selected by a tree decoder responsive to the comparator output. The analog switch has two transistors, the first transistor being connected between the resistor ladder network and the comparator and being gated by a second transistor and the tree decoder so that the first transistor may be precharged or accessed by the tree decoder.

3 Claims, 4 Drawing Figures

ANALOG/DIGITAL CONVERTER UTILIZING A SINGLE COLUMN OF ANALOG SWITCHES

BACKGROUND OF THE INVENTION

1. Field of the Invention

This invention relates to semiconductor analog-to-digital converters and more particularly, but not by way of limitation, to a switch for use in an analog-to-digital converter.

2. Description of the Prior Art

Referring to FIG. 1, a typical potentiometric analog-to-digital converter can be observed. As can be seen, a large number of resistors and analog switches is required to handle a small number of bits. In the industry, much effort has been made to reduce the number of required resistors and switches.

As can be seen, the industry's standard is now a monolithic successive approximation analog-to-digital converter. This converter uses a sampled-data comparator and a multi-tapped diffused-resistor string (ladder) between the reference voltage ($V_{ref}$) and ground. A tap is provided for each of the $2^N$ possible analog voltage levels. Note that for an eight bit design, 256 resistors and 510 ($2^{N+1}-2$) analog decoder switches are needed. Eight switches are placed in a series between each tap on the ladder and the comparator input. By a successive approximation technique, a tree decoder differentially arrives at the voltage level approximating the analog input.

Referring now to FIG. 1, there is shown an analog level output line 10, a resistor ladder network 12, a comparator 14, an analog input 16, digital inputs 18 and switches or tree decoder 20. Further, note that the resistor ladder network 12 is connected in series and supplied with a voltage reference at one end and grounded at the other end. Locations in the resistor ladder network 12 are addressed by the digital inputs 18 and read out through the output line 10. This output is compared to the analog input 16 by the comparator 14 which addressed control logic to determine the next resistor ladder network location. By successive approximation, a level nearest the analog input 16 is obtained.

SUMMARY OF THE INVENTION

The present invention may be described as an analog-digital converter switch in which the resistor ladder network location is addressed as in the prior art but is read out through a single analog switch. This allows the converter to operate in a digital fashion with more exact voltage levels and avoids a read out through the tree decoder with the accompanying noise, oscillation and speed problems. Each switch has a first transistor which is connected by its source to the resistor ladder and is gated by the tree decoder. The gate of the first transistor is further attached to the drain of a second transistor with its source tied to a supply voltage. The second transistor is a precharge device and is accordingly gated by a precharge signal. The analog signal will be read at the drain of the first transistor.

DESCRIPTION OF PREFERRED EMBODIMENT

Figure 1:
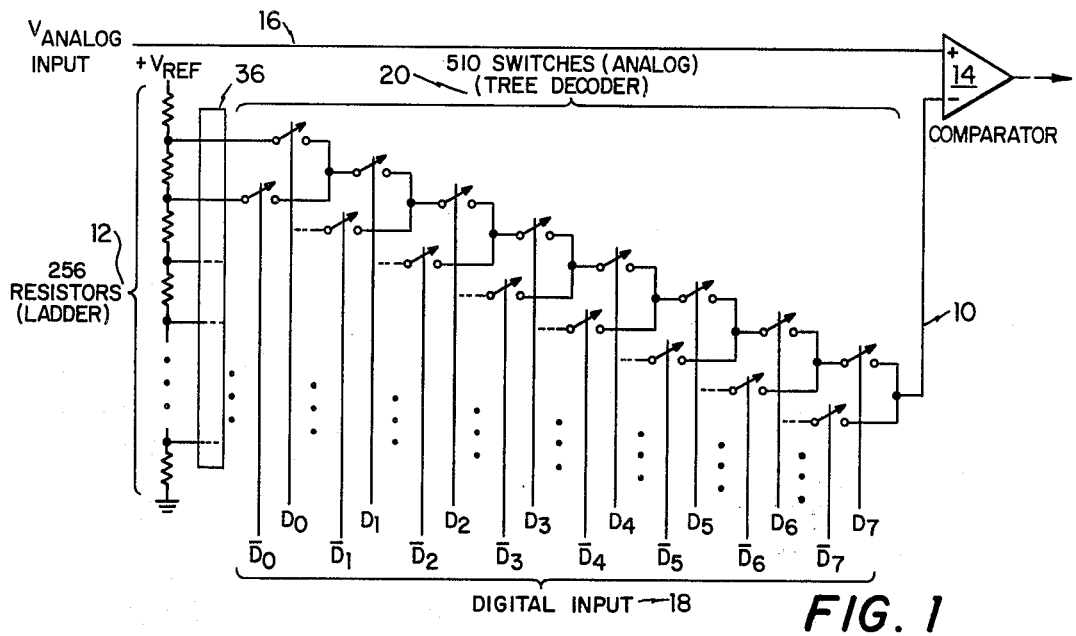
FIG. 1 is a schematic view of a prior art analog-to-digital converter.
Figure 2:
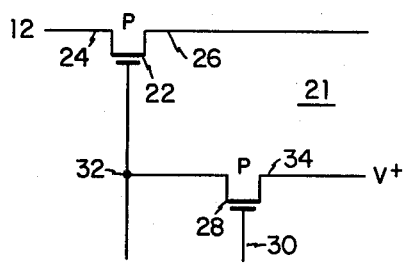
FIG. 2 is a schematic diagram of the analog/digital converter switch which is the subject of this invention.

With reference to FIG. 2, a preferred embodiment of the invention includes a first transistor 22 which has its source 24 attached to the analog signal to be read from the resistor ladder 12. The analog signal will be read at the drain 26. A second transistor 28 is included in the switch 21 which is gated by a precharge signal on line 30. The gate of the transistor 22 and the drain of the transistor 28 is labeled 32 and is the point of connection to the tree decoder 20. The source 34 of the transistor 28 is connected to a positive voltage supply which is gated by the precharge signal on line 30 at a time when the signal from the tree decoder 20 is off. Referring to FIG. 1, the box 36 shows the placement of an array of switches 21 as shown in FIG. 2 on the voltage taps of the resistor ladder network 12. As can be seen the switch in FIG. 2 is placed between the resistor ladder network 12 and the tree decoder 20.

Figure 3:
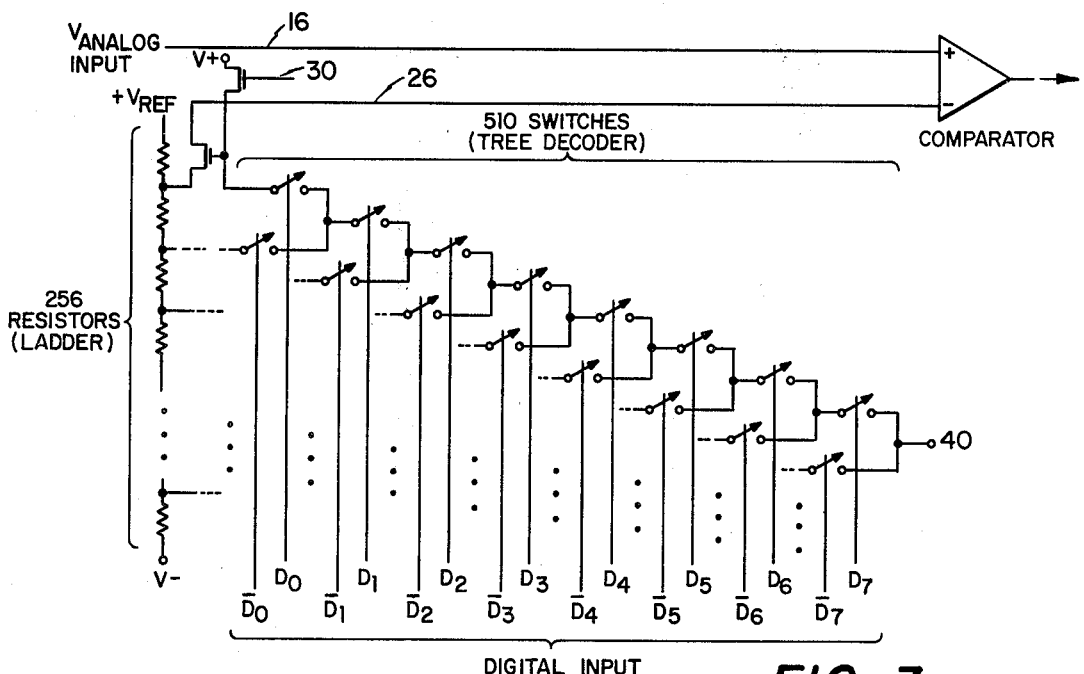
FIG. 3 is a schematic diagram of an analog-to-digital converter using the present invention.

Referring to FIG. 3 a representation of an analog-to-digital converter is shown using the present invention. It can be seen that line 10 from the FIG. 1 is not an input to the comparator but rather an output 26 is the input to the comparator. The output 26 can represent a common bus of outputs 26 from a switch at each location on the resistor ladder. In this manner a strong analog signal level is read at the comparator to be compared to the analog input 16. Note that in this manner only 256 analog switches need be used in an eight bit decoder as compared to the prior art requirement of 510 switches.

This is in addition to the improvement in the level of signals obtained. Instead of reading a signal through n switches in an n-bit converter, the signal is read from the output 26.

Because the switch accesses the analog voltage on the resistor ladder in response to the command signal from the tree decoder, the tree decoder can operate at digital levels and speeds. This is a much more efficient and rapid mode of operation. The prior art did not utilize the rise times and switching levels available through the use of digital signals in the MOS devices in the tree decoder and instead used the slower analog tree decoding.

In operation, when not being accessed, the analog switches 22 are held in the off state by transistor 28 which is turned on by precharge signal 30. When it is desired to read a voltage tap on the resistor ladder 12, the precharge signal 30 is turned off. Simultaneously, transistor 28 turns off, and the tree decoder 20 is enabled to pull the selected analog transistor's gate to voltage 40 which turns on that analog transistor. All unselected analog switches remain in the off state, held off by their gate capacitance maintaining the precharge voltage level previously applied.

Figure 4:
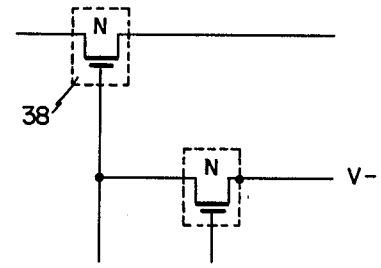
FIG. 4 shows a variation of the invention where an N analog switch is required.

It should be noted that the resistor ladder 12 will require p channel and n channel analog switches as described in one embodiment this invention. In a typical converter, one-half of the resistor ladder utilizes p channel switches and the other half n channel. These different channel devices operate better at the different voltage levels. The above description applies to a p channel analog switch. Referring to FIG. 4 an n channel analog switch is shown. The circuit diagram is substantially similar, but the supply voltage will be a negative voltage and a p well bias voltage will be applied at 38. Note that the voltage 40 will be at the opposite end of the supply voltage range from the precharge switch voltage supply for each type of switch and the type of channel of the device in the tree decoder will change with the switch type. For instance, a p type analog switch will normally use an n channel tree decoder with a voltage 40 at a negative supply voltage. The precharge switch voltage supply will be a positive voltage supply.

Finally, it must be noted that the invention is not limited to an analog-to-digital converter. It would similarly be applicable to a digital-to-analog converter because of the MOS design and structure.

While rather specific terms have been used to describe one embodiment of the present invention, they are not intended nor should they be construed as a limitation upon the invention as defined by the following claims.

What is claimed is:

1. A method for converting an analog signal to a digital voltage level comprising:
   inputting high and low reference voltages to a series resistor ladder network having incremental levels;
   comparing the analog signal and the center incremental voltage level of the resistor ladder network;
   selecting an incremental level midway between the center incremental level and the high reference voltage or the low reference voltage depending on whether the analog signal voltage level is greater or lesser, respectively, than the center incremental voltage level;
   comparing the analog signal to the selected incremental voltage level;
   repeating the selection of an incremental voltage level and comparison of the analog signal and selected incremental voltage level until the incremental voltage levels are exhausted whereby the incremental voltage level nearest the analog signal to voltage level is determined;
   precharging with a voltage level a gate terminal of a plurality of series field effect transistors coupled between each incremental voltage level and a comparator such that each of the field effect transistors is in the off state;
   removing the precharging voltage at the gates of the plurality of series field effect transistors when a decode tree, coupled to the gates of the plurality of field effect transistors, enables one of the plurality of series field effect transistors; and
   holding the unselected series field effect transistors off by the remnants of the precharge voltage held by the respective gate capacitances.

2. An analog-to-digital converter for converting an analog signal to a digital level comprising:
   a first and a second reference voltage terminal;
   a series resistor ladder network connected between the first and second reference voltage terminals and having a plurality of taps at incremental voltage levels;
   A switch array coupled between the taps of the ladder network and a common output terminal and having a like plurality of analog switches for detecting an incremental voltage in the resistor ladder network;
   a digital decode tree coupled to the switch array for selecting a single analog switch in the switch array;
   the analog switches comprised of a series field effect transistor having drain, source and gate terminals, the source terminal coupled to one of the plurality of taps, the drain terminal coupled to the common output terminal, the gate terminal coupled to the digital decode tree, and means for precharging the gate terminal at a time when the digital decode tree is not selecting a single analog switch in the switch array;
   a comparator for receiving the analog signal and the signal at the common output terminal and producing an output determined by the difference in the analog signal and signal at the common output terminal; and
   means responsive to the comparator output and logically controlling the decode tree selection of analog switches in the switch array whereby the incremental voltage level approximating the analog signal may be determined.

3. The analog-to-digital converter of claim 2 wherein the means for precharging the gate terminal comprises:
   a second field effect transistor having its drain connected to the gate of the series field effect transistor and to the decoder tree, its source connected to a supply voltage, and its gate connected to a precharge signal.

* * * * *